(12) United States Patent
Nannapaneni et al.

(10) Patent No.: US 12,060,639 B2
(45) Date of Patent: Aug. 13, 2024

(54) RAPID FLUSH PURGING DURING ATOMIC LAYER DEPOSITION

(71) Applicant: Lam Research Corporation, Fremont, CA (US)

(72) Inventors: Pragna Nannapaneni, San Jose, CA (US); Sema Ermez, Santa Clara, CA (US); Novy Tjokro, Union City, CA (US); Ruopeng Deng, San Jose, CA (US); Tianhua Yu, Tracy, CA (US); Xiaolan Ba, Fremont, CA (US); Juwen Gao, San Jose, CA (US); Sanjay Gopinath, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 185 days.

(21) Appl. No.: 17/594,366

(22) PCT Filed: Apr. 15, 2020

(86) PCT No.: PCT/US2020/028360
§ 371 (c)(1),
(2) Date: Oct. 13, 2021

(87) PCT Pub. No.: WO2020/214732
PCT Pub. Date: Oct. 22, 2020

(65) Prior Publication Data
US 2022/0186370 A1 Jun. 16, 2022

Related U.S. Application Data

(60) Provisional application No. 62/836,275, filed on Apr. 19, 2019.

(51) Int. Cl.
*C23C 16/455* (2006.01)
*C23C 16/08* (2006.01)
(Continued)

(52) U.S. Cl.
CPC ........ *C23C 16/45527* (2013.01); *C23C 16/08* (2013.01); *H01L 21/28568* (2013.01);
(Continued)

(58) Field of Classification Search
CPC .............. C23C 16/45527; C23C 16/08; H01L 21/28568; H01L 21/28518
(Continued)

(56) References Cited

U.S. PATENT DOCUMENTS 4,099,990 A 7/1978 Brown et al.
4,740,480 A 4/1988 Ooka
(Continued)

FOREIGN PATENT DOCUMENTS

CN 1722403 A 1/2006
EP 1063692 A1 12/2000
(Continued)

OTHER PUBLICATIONS

Bekiari, V. et al. (1998) "Characterization of Photoluminescence from a Material Made by Interaction of (3-Aminopropyl)triethoxysilane with Acetic Acid," Langmuir, 14(13):3459-3461.
(Continued)

*Primary Examiner* — Jasmine J Clark
(74) *Attorney, Agent, or Firm* — Weaver Austin Villeneuve & Sampson LLP

(57) ABSTRACT

Provided herein are methods and related apparatus for purging processing chambers during an atomic layer deposition (ALD) process. The methods involve flowing purging gas from one or more accumulators to remove process gases from the processing chambers. Following the flowing of purging gas, additional reactants may be introduced into the processing chamber to continue an ALD cycle.

20 Claims, 9 Drawing Sheets

(51) Int. Cl.
  *H01L 21/285* (2006.01)
  *H01L 21/768* (2006.01)
  *H10B 12/00* (2023.01)
  *H10B 41/27* (2023.01)
  *H10B 43/27* (2023.01)

(52) U.S. Cl.
  CPC ............ *H01L 21/768* (2013.01); *H10B 12/00* (2023.02); *H10B 41/27* (2023.02); *H10B 43/27* (2023.02)

(58) Field of Classification Search
  USPC ....................................................... 438/680
  See application file for complete search history.

(56) References Cited

U.S. PATENT DOCUMENTS

| | | |
|---|---|---|
| 4,923,720 A | 5/1990 | Lee et al. |
| 5,281,274 A | 1/1994 | Yoder |
| 5,320,983 A | 6/1994 | Ouellet |
| 5,387,546 A | 2/1995 | Maeda et al. |
| 5,516,721 A | 5/1996 | Galli et al. |
| 5,525,157 A | 6/1996 | Hawkins et al. |
| 5,534,731 A | 7/1996 | Cheung |
| 5,747,381 A | 5/1998 | Wu et al. |
| 5,807,785 A | 9/1998 | Ravi |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 5,990,013 A | 11/1999 | Berenguer et al. |
| 6,013,581 A | 1/2000 | Wu et al. |
| 6,054,379 A | 4/2000 | Yau et al. |
| 6,060,384 A | 5/2000 | Chen et al. |
| 6,072,227 A | 6/2000 | Yau et al. |
| 6,114,224 A | 9/2000 | Ngo et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,242,366 B1 | 6/2001 | Beekman et al. |
| 6,287,989 B1 | 9/2001 | Dobson |
| 6,300,219 B1 | 10/2001 | Doan et al. |
| 6,309,933 B1 | 10/2001 | Li et al. |
| 6,323,123 B1 | 11/2001 | Liu et al. |
| 6,383,951 B1 | 5/2002 | Li |
| 6,399,213 B2 | 6/2002 | Shiokawa |
| 6,413,583 B1 | 7/2002 | Moghadam et al. |
| 6,448,187 B2 | 9/2002 | Yau et al. |
| 6,475,564 B1 | 11/2002 | Carter et al. |
| 6,544,858 B1 | 4/2003 | Beekman et al. |
| 6,635,586 B2 | 10/2003 | Goo et al. |
| 6,640,840 B1 | 11/2003 | MacNeil |
| 6,653,247 B2 | 11/2003 | MacNeil |
| 6,660,663 B1 | 12/2003 | Cheung et al. |
| 6,743,436 B1 | 6/2004 | Lee et al. |
| 6,743,736 B2 | 6/2004 | Mardian et al. |
| 6,787,463 B2 | 9/2004 | Mardian et al. |
| 6,790,737 B2 | 9/2004 | Schneegans et al. |
| 6,812,135 B2 | 11/2004 | Li et al. |
| 6,828,162 B1 | 12/2004 | Halliyal et al. |
| 6,846,757 B2 | 1/2005 | MacNeil |
| 6,858,195 B2 | 2/2005 | Aronowitz et al. |
| 6,902,947 B2 | 6/2005 | Chinn et al. |
| 6,972,262 B2 | 12/2005 | Lee et al. |
| 6,984,561 B2 | 1/2006 | Herner et al. |
| 6,995,056 B2 | 2/2006 | Lee et al. |
| 7,033,945 B2 | 4/2006 | Byun et al. |
| 7,056,560 B2 | 6/2006 | Yim et al. |
| 7,071,126 B2 | 7/2006 | Johnston et al. |
| 7,074,690 B1 | 7/2006 | Gauri et al. |
| 7,074,727 B2 | 7/2006 | Hsu et al. |
| 7,084,505 B2 | 8/2006 | Hamada et al. |
| 7,153,783 B2 | 12/2006 | Lu et al. |
| 7,211,525 B1 | 5/2007 | Shanker et al. |
| 7,238,604 B2 | 7/2007 | Kloster et al. |
| 7,365,000 B2 | 4/2008 | Lee et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,575,633 B2 | 8/2009 | Romanin |
| 7,582,555 B1 | 9/2009 | Lang et al. |
| 7,585,704 B2 | 9/2009 | Belyansky et al. |
| 7,589,012 B1 | 9/2009 | Seo et al. |
| 7,622,369 B1 | 11/2009 | Lee et al. |
| 7,629,227 B1 | 12/2009 | Wang et al. |
| 7,655,532 B1 | 2/2010 | Chen et al. |
| 7,727,906 B1 | 6/2010 | Shanker et al. |
| 7,794,544 B2 | 9/2010 | Nguyen et al. |
| 7,804,130 B1 | 9/2010 | Fung |
| 7,825,044 B2 | 11/2010 | Mallick et al. |
| 7,888,233 B1 | 2/2011 | Gauri et al. |
| 7,888,273 B1 | 2/2011 | Wang et al. |
| 7,915,139 B1 | 3/2011 | Lang et al. |
| 8,187,951 B1 | 5/2012 | Wang et al. |
| 8,278,224 B1 | 10/2012 | Mui et al. |
| 8,481,403 B1 | 7/2013 | Gauri et al. |
| 8,557,712 B1 | 10/2013 | Antonelli et al. |
| 8,580,697 B1 | 11/2013 | Lang et al. |
| 8,685,867 B1 | 4/2014 | Danek et al. |
| 8,728,958 B2 | 5/2014 | Ashtiani et al. |
| 8,809,161 B2 | 8/2014 | Gauri et al. |
| 8,846,536 B2 | 9/2014 | Draeger et al. |
| 9,064,684 B1 | 6/2015 | Mui et al. |
| 11,549,175 B2 * | 1/2023 | Butail ................. C23C 16/54 |
| 2002/0006729 A1 | 1/2002 | Geiger et al. |
| 2003/0040199 A1 | 2/2003 | Agarwal |
| 2003/0066482 A1 | 4/2003 | Pokharna et al. |
| 2003/0077887 A1 | 4/2003 | Jang et al. |
| 2003/0146416 A1 | 8/2003 | Takei et al. |
| 2003/0159655 A1 | 8/2003 | Lin et al. |
| 2003/0194861 A1 | 10/2003 | Mardian et al. |
| 2003/0210065 A1 | 11/2003 | Lu et al. |
| 2004/0048455 A1 | 3/2004 | Karasawa et al. |
| 2004/0152342 A1 | 8/2004 | Li et al. |
| 2004/0169005 A1 | 9/2004 | Kim et al. |
| 2004/0224496 A1 | 11/2004 | Cui et al. |
| 2005/0026443 A1 | 2/2005 | Goo et al. |
| 2005/0112282 A1 | 5/2005 | Gordon et al. |
| 2005/0136684 A1 | 6/2005 | Mukai et al. |
| 2005/0150453 A1 | 7/2005 | Simmons et al. |
| 2005/0181566 A1 | 8/2005 | Machida et al. |
| 2005/0208718 A1 | 9/2005 | Lim et al. |
| 2005/0212179 A1 | 9/2005 | Honda et al. |
| 2005/0260864 A1 | 11/2005 | Huang et al. |
| 2006/0014384 A1 | 1/2006 | Lee et al. |
| 2006/0024912 A1 | 2/2006 | Lee |
| 2006/0110533 A1 | 5/2006 | Hwang et al. |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2007/0054505 A1 | 3/2007 | Antonelli et al. |
| 2007/0065578 A1 * | 3/2007 | McDougall ......... C23C 16/4408 427/248.1 |
| 2007/0281495 A1 | 12/2007 | Mallick et al. |
| 2007/0298585 A1 | 12/2007 | Lubomirsky et al. |
| 2008/0020591 A1 | 1/2008 | Balseanu et al. |
| 2008/0081434 A1 | 4/2008 | Nam et al. |
| 2008/0132087 A1 | 6/2008 | Xia et al. |
| 2009/0020847 A1 | 1/2009 | Byun et al. |
| 2009/0053895 A1 | 2/2009 | Oshima et al. |
| 2009/0061647 A1 | 3/2009 | Mallick et al. |
| 2009/0104789 A1 | 4/2009 | Mallick et al. |
| 2009/0104790 A1 | 4/2009 | Liang |
| 2009/0298257 A1 | 12/2009 | Lee et al. |
| 2009/0321936 A1 | 12/2009 | Kojima et al. |
| 2010/0109155 A1 | 5/2010 | Liu et al. |
| 2010/0167533 A1 | 7/2010 | Lim et al. |
| 2011/0081782 A1 | 4/2011 | Liang et al. |
| 2011/0151678 A1 | 6/2011 | Ashtiani et al. |
| 2012/0149213 A1 | 6/2012 | Nittala et al. |

(56) References Cited

U.S. PATENT DOCUMENTS

| | | | |
|---|---|---|---|
| 2012/0161405 | A1 | 6/2012 | Mohn et al. |
| 2012/0164328 | A1 | 6/2012 | Kojima et al. |
| 2013/0122718 | A1 | 5/2013 | Kato et al. |
| 2013/0230987 | A1 | 9/2013 | Draeger et al. |
| 2014/0017904 | A1 | 1/2014 | Gauri et al. |
| 2014/0302689 | A1 | 10/2014 | Ashtiani et al. |
| 2017/0317194 | A1 | 11/2017 | Tang et al. |
| 2019/0112707 | A1 | 4/2019 | Liu |

FOREIGN PATENT DOCUMENTS

| | | | |
|---|---|---|---|
| JP | 2001148382 A | | 5/2001 |
| JP | 2010153859 A | | 7/2010 |
| WO | WO-2007140376 | A2 | 12/2007 |
| WO | WO-2007140424 | A2 | 12/2007 |
| WO | WO-2011072143 | A2 | 6/2011 |

OTHER PUBLICATIONS

Brankova et al. (2003) "Photoluminescence from Sol-Gel Organic/Inorganic Hybrid Gels Obtained through Carboxylic Acid Solvolysis," Chem. Mater., 15(9):1855-1859.

Chinese First Office Action dated Feb. 8, 2014 issued in CN 2010-80055670.3.

Chung, Sung-Woong, et al. (2002) "Novel Shallow Trench Isolation Process Using Flowable Oxide CVD for sub-100nm Dram," IEEE, IEDM, pp. 233-236.

Chung, Sung-Woong et al. (Mar. 2004) "Flowable Oxide CVD Process For Shallow Trench Isolation in Silicon Semiconductor," Journal of Semiconductor Technology and Science, 4(1):45-51.

Fessenden et al. (1961) "The Chemistry of Silicon-Nitrogen Compounds," Chem. Rev. 61(4)361-388.

Hatanaka, M., et al. (Jun. 11-12, 1991) "H2O-TEOS Plasma-CVD Realizing Dielectrics Having a Smooth Surface," IEEE, VMIC Conference, pp. 435-441.

International Preliminary Report of Patentability dated Oct. 28, 2021 in PCT Application No. PCT/US2020/028360.

International Search Report and Written Opinion dated Jul. 31, 2020 in PCT Application No. PCT/US2020/028360.

Japanese Office Action dated Jun. 3, 2014 issued in JP2009-282737.

Japanese Office Action dated Sep. 17, 2013 issued in JP2009-282737.

Kessler et al.(2006) "New insight in the role of modifying ligands in the sol-gel processing of metal alkoxide precursors: A possibility to approach new classes of materials," J. Sol-Gel Sci. Techn. 40(2-3):163-179.

Matsuura, M., et al. (1994) "Novel Self-Planarizing CVD Oxide for Interlayer Dielectric Applications," IEEE, pp. 117-120.

Nakano, M., et al. (1989) "Digital CVD of SiO2," Extended Abstracts of the 21st Conference on Solid State Devices and Materials, Tokyo, pp. 49-52.

Noguchi, S. et al. (1987) "Liquid Phase Oxidation Employing O Atoms Produced by Microwave Discharge and Si(CH3)4," Extended Abstracts of the 19th Conference on Solid State Devices and Materials, Tokyo, pp. 451-454.

PCT International Preliminary Report on Patentability and Written Opinion dated Jun. 21, 2012 issued in PCT/US2010/059721.

PCT International Search Report and Written Opinion dated Aug. 10, 2011 issued in PCT/US2010/059721.

Sakaue, H., et al. (1991) "Digital Chemical Vapor Deposition of SiO2 Using a Repetitive Reaction of Triethylsilane /Hydrogen and Oxidation," Department of Electrical Engineering, Hiroshima University, Japanese Journal of Applied Physics, 30(1B):L124-L127.

Stathatos et al. (Jul. 19, 2003) "Study of Acetic Acid-Catalyzed Nanocomposite Organic/Inorganic Ureasil Sol-Gel Ionic Conductors," Langmuir, 19:(18)7587-7591.

U.S. Final Office Action, dated Apr. 22, 2010, issued in U.S. Appl. No. 11/834,581.

U.S. Final Office Action, dated Apr. 9, 2008, issued in U.S. Appl. No. 11/323,812.

U.S. Final Office Action, dated Aug. 26, 2014, issued in U.S. Appl. No. 13/461,287.

U.S. Final Office Action, dated Aug. 6, 2009, issued in U.S. Appl. No. 11/834,581.

U.S. Final Office Action, dated Dec. 11, 2013, issued in U.S. Appl. No. 13/607,511.

U.S. Final Office Action, dated Feb. 3, 2014, issued in U.S. Appl. No. 13/493,936.

U.S. Final Office Action, dated Jul. 29, 2014, issued in U.S. Appl. No. 13/313,735.

U.S. Final Office Action, dated Jun. 17, 2009, issued in U.S. Appl. No. 11/925,514.

U.S. Final Office Action, dated Jun. 25, 2012, issued in U.S. Appl. No. 12/986,070.

U.S. Final Office Action, dated Mar. 30, 2012, issued in U.S. Appl. No. 12/334,726.

U.S. Final Office Action, dated Oct. 14, 2011, issued in U.S. Appl. No. 12/625,468.

U.S. Final Office Action, dated Oct. 26, 2010, issued in U.S. Appl. No. 12/334,726.

U.S. Final Office Action, dated Sep. 12, 2013, issued in U.S. Appl. No. 12/964,110.

U.S. Final Office Action, dated Sep. 13, 2010, issued in U.S. Appl. No. 12/411,243.

U.S. Final Office Action, dated Sep. 14, 2012, issued in U.S. Appl. No. 12/984,524.

U.S. Notice of Allowance and Fee Due, dated Apr. 23, 2009, issued in U.S. Appl. No. 11/323,812.

U.S. Notice of Allowance and Fee Due, dated Dec. 11, 2008, issued in U.S. Appl. No. 11/447,594.

U.S. Notice of Allowance and Fee Due, dated Feb. 15, 2006, issued in U.S. Appl. No. 10/810,066.

U.S. Notice of Allowance, dated Apr. 11, 2014, issued in U.S. Appl. No. 13/935,398.

U.S. Notice of Allowance, dated Apr. 23, 2014, issued in U.S. Appl. No. 12/964,110.

U.S. Notice of Allowance, dated Aug. 6, 2012, issued in U.S. Appl. No. 13/031,077.

U.S. Notice of Allowance, dated Dec. 27, 2013, issued in U.S. Appl. No. 12/964,110.

U.S. Notice of Allowance, dated Jan. 23, 2015, issued in U.S. Appl. No. 13/607,511.

U.S. Notice of Allowance, dated Jan. 31, 2012, issued in U.S. Appl. No. 12/625,468.

U.S. Notice of Allowance, dated Jul. 29, 2009, issued in U.S. Appl. No. 11/925,514.

U.S. Notice of Allowance, dated Jul. 8, 2013, issued in U.S. Appl. No. 13/031,077.

U.S. Notice of Allowance dated Jun. 10, 2013, issued in U.S. Appl. No. 12/334,726.

U.S. Notice of Allowance, dated Jun. 21, 2012, issued in U.S. Appl. No. 12/566,085.

U.S. Notice of Allowance, dated Mar. 7, 2013, issued in U.S. Appl. No. 12/984,524.

U.S. Notice of Allowance, dated May 22, 2014, issued in U.S. Appl. No. 13/493,936.

U.S. Notice of Allowance, dated May 29, 2012, issued in U.S. Appl. No. 12/566,085.

U.S. Notice of Allowance, dated Nov. 18, 2010, issued in U.S. Appl. No. 12/508,461.

U.S. Notice of Allowance, dated Nov. 8, 2013, issued in U.S. Appl. No. 13/315,123.

U.S. Notice of Allowance, dated Oct. 6, 2010, issued in U.S. Appl. No. 12/411,243.

U.S. Notice of Allowance, dated Oct. 7, 2010, issued in U.S. Appl. No. 11/834,581.

U.S. Office Action, dated Apr. 26, 2011, issued in U.S. Appl. No. 12/625,468.

U.S. Office Action, dated Aug. 15, 2013, issued in U.S. Appl. No. 13/461,287.

(56) References Cited

OTHER PUBLICATIONS

U.S. Office Action, dated Aug. 23, 2005, issued in U.S. Appl. No. 10/810,066.
U.S. Office Action, dated Dec. 16, 2013, issued in U.S. Appl. No. 13/935,398.
U.S. Office Action dated Dec. 18, 2009, issued in U.S. Appl. No. 11/834,581.
U.S. Office Action, dated Dec. 21, 2012, issued in U.S. Appl. No. 12/964,110.
U.S. Office Action, dated Dec. 6, 2012, issued in U.S. Appl. No. 13/315,123.
U.S. Office Action, dated Feb. 26, 2010, issued in U.S. Appl. No. 12/334,726.
U.S. Office Action, dated Feb. 28, 2014, issued in U.S. Appl. No. 13/461,287.
U.S. Office Action, dated Jul. 15, 2013, issued in U.S. Appl. No. 13/315,123.
U.S. Office Action, dated Jul. 25, 2014, issued in U.S. Appl. No. 13/607,511.
U.S. Office Action, dated Jun. 21, 2013, issued in U.S. Appl. No. 13/607,511.
U.S. Office Action, dated Jun. 27, 2008, issued in U.S. Appl. No. 11/447,594.
U.S. Office Action, dated May 18, 2012, issued in U.S. Appl. No. 12/984,524.
U.S. Office Action, dated May 24, 2010, issued in U.S. Appl. No. 12/411,243.
U.S. Office Action, dated Nov. 12, 2008, issued in U.S. Appl. No. 11/834,581.
U.S. Office Action, dated Nov. 25, 2011, issued in U.S. Appl. No. 12/986,070.
U.S. Office Action, dated Nov. 4, 2008, issued in U.S. Appl. No. 11/925,514.
U.S. Office Action, dated Nov. 8, 2013, issued in U.S. Appl. No. 13/313,735.
U.S. Office Action, dated Oct. 10, 2014, issued in U.S. Appl. No. 13/313,735.
U.S. Office Action, dated Oct. 23, 2012, issued in U.S. Appl. No. 12/334,726.
U.S. Office Action, dated Oct. 26, 2007, issued in U.S. Appl. No. 11/323,812.
U.S. Office Action, dated Oct. 9, 2008, issued in U.S. Appl. No. 11/323,812.
U.S. Office Action, dated Sep. 12, 2013, issued in U.S. Appl. No. 13/493,936.
U.S. Office Action, dated Sep. 16, 2011, issued in U.S. Appl. No. 12/334,726.
U.S. Appl. No. 12/986,070, Inventors Wang et al., filed Jan. 6, 2011.

* cited by examiner

RAPID FLUSH PURGING DURING ATOMIC LAYER DEPOSITION

INCORPORATED BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Tungsten (W) film deposition using atomic layer deposition (ALD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including depositing void free and tow stress films.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Disclosed herein are atomic layer deposition (ALD) methods that include rapidly purging reactant gases. During an ALD cycle, reactant gas doses are sequentially flowed into a chamber to react on the substrate surface. Sequential reactant gas doses are separated by a purge operation in which an inert gas is flowed through the chamber to remove remaining reactant gas of the preceding dose. Rapid flush purging uses two or more accumulators to sequentially flow pressurized purge gases into the chamber during a single purge operation. Rapid flush purging increases the overall mass flow rate, decreases purge time and improves throughput. For ALD of films such as tungsten, rapid flush purging improves the material properties of the deposited films.

In one aspect of the embodiments herein, a method is disclosed, the method including: providing a semiconductor substrate to a chamber having a chamber pressure less than 100 torr, wherein the semiconductor substrate includes a partially fabricated three-dimensional (3-D) NAND structure including sidewalls and a plurality of openings in the sidewalls leading to a plurality of features having a plurality of interior regions fluidically accessible through the openings; depositing a material on the semiconductor substrate by multiple ALD cycles, wherein each cycle includes flowing into the chamber in sequence: a reducing agent; a first purge gas; a tungsten precursor; and a second purge gas; and wherein flowing the first purge gas and the second purge gas includes flowing purging gas from a first accumulator with a first charge pressure, followed by flowing purging gas from a second accumulator with a second charge pressure within 5 seconds of flowing the purging gas from the first accumulator, and the first charge pressure and the second charge pressure are between about 400 torr and about 1000 torr.

In another aspect of the embodiments herein, a method is disclosed, the method including: providing a semiconductor substrate to a chamber having a chamber pressure; depositing a material on the semiconductor substrate by multiple ALD cycles, wherein each cycle includes flowing into the chamber in sequence; a reactant; and a purge gas; wherein flowing the purge gas includes flowing purging gas from a first accumulator with a first charge pressure, followed by flowing purging gas from a second accumulator with a second charge pressure.

In some embodiments, the first charge pressure and second charge pressure are at least two times greater than the chamber pressure. In various embodiments, the chamber pressure before flowing the purge gas or the second purge gas is less than 100 torr. In some embodiments, the first charge pressure and second charge pressure are between about 400 torr and 1000 torr.

In various implementations the purging gas is helium, nitrogen, argon, or xenon, in some embodiments, the reactant includes a reducing agent. In certain embodiments, the reducing agent is $B_2H_6$, $SiH_4$, or $H_2$. In some embodiments, the reactant includes a metal precursor. In some embodiments, the metal precursor is a metal halide. In various implementations, the metal precursor is a metal oxyhalide. In certain embodiments, the metal precursor is a tungsten precursor. In various embodiments, the tungsten precursor is one of tungsten hexafluoride ($WF_6$), tungsten hexachloride ($WCl_6$), tungsten pentachloride ($WCl_5$), tungsten tetrachloride ($WCl_4$), tungsten dichloride ($WCl_2$), tungsten oxytetrachloride ($WOCl_4$) or tungsten dichloride dioxide ($WO_2Cl_2$).

In some embodiments, the metal precursor is a molybdenumprecursor In certain embodiments, the molybdenum precursor is one of: molybdenum pentachloride ($MoCl_5$), molybdenum hexafluoride ($MoF_6$), molybdenum dichloride dioxide ($MoO_2Cl_2$), molybdenum oxytetrachloride ($MoOCl_4$), and molybdenum oxytetrachloride ($MoOF_4$).

In various implementations, flowing the purge gas is a choked flow. In some implementations, flowing purging gas from the first accumulator is at least partially a choked flow. In certain embodiments, flowing purging gas from the second accumulator occurs during the choked flow portion of flowing purging gas from the first accumulator. In some embodiments, the flowing purging gas from the second accumulator occurs less than 5 seconds after flowing purging gas from the first accumulator.

In various embodiments, the semiconductor substrate includes a partially fabricated three-dimension (3-D) NAND structure including sidewalls and a plurality of openings in the sidewalls leading to a plurality of features having a plurality of interior regions fluidically accessible through the openings.

These and other features of the disclosed embodiments ill be described in detail below with reference to the associated drawings.

DETAILED DESCRIPTION

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Described, herein are methods of atomic layer deposition (ALD) and related systems and apparatus, Examples of applications include logic and memory contact fill DRAM buried wordline fill, vertically integrated memory gate/ wordline fill, and 3-D integration with through-silicon vias (TSVs). In some embodiments, the methods may be used for tungsten feature fill. Such features can include vertical features, such as vias, and horizontal features, such as vertical NAND (VNAND) wordlines.

Disclosed herein are atomic layer deposition (ALD) methods that include rapidly purging reactant gases. During an ALD cycle, reactant gas doses are sequentially flowed into a chamber to react on the substrate surface. Sequential reactant gas doses are separated by a purge operation in which an inert gas is flowed through the chamber to remove remaining reactant gas of the preceding dose. Rapid flush purging uses two or more accumulators to sequentially flow pressurized purge gases into the chamber during a single purge operation. In some embodiments, one or more of the following advantages may be realized. In some embodiments, the overall mass flow rate is increased, which can result in decreased purge time and improved throughput. In some embodiments, the internal stress of the deposited films is reduced. In some embodiments, impurities in deposited films are reduced.

ALD is a technique that deposits thin layers of material using sequential self-limiting reactions. The concept of an "ALD cycle" is relevant to the discussion of various embodiments herein. Generally an ALD cycle is the minimum set of operations used to perform a surface deposition reaction one time. The result of one cycle is production of at least a partial film layer on a substrate surface. Typically, an ALD cycle includes operations to deliver and adsorb at least one reactant to the substrate surface, and then react the adsorbed reactant with one or more reactants to form the partial layer of film. In the methods described herein, a cycle also includes at least one rapid flush purge as described further below. Generally, a cycle contains one instance of a unique sequence of operations. As an example, an ALD cycle may include the following operations: (i) delivery/ adsorption of a reactant A, (ii) purging of reactant A from the chamber, (iii) delivery of a reactant B, and (iv) purging of reactant B from the chamber.

Figure 1:
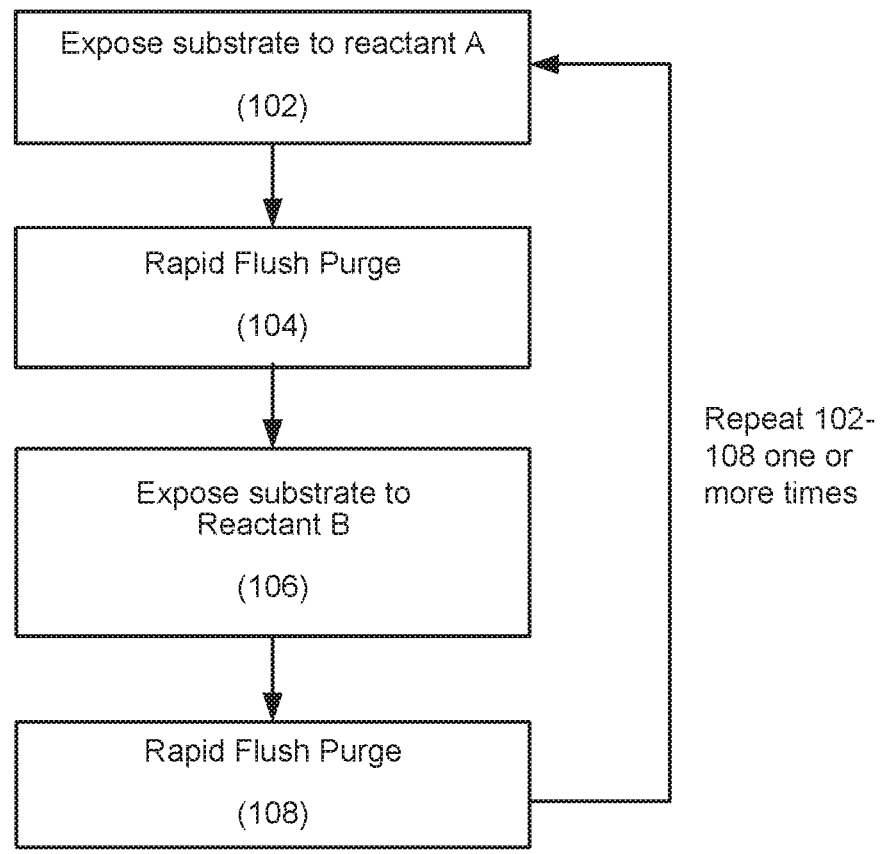
FIG. 1 presents a flow diagram of an operation for one example embodiment.

FIG. 1 is a process flow diagram of steps of a method in accordance with various embodiments. Cycle and exposure times described herein may depend on the apparatus and platform used and one of ordinary skill in the art may adjust cycle and exposure times accordingly. In operation 102, a reactant A is introduced to a process chamber. For the deposition of conductive films, reactant A may be a metal-containing precursor or a reducing agent or other co-reactant. While the description below chiefly describes thermal atomic layer deposition (ALD) of metals, the methods may also be implemented to deposit any material by thermal ALD.

After operation 102, the process chamber is purged by a rapid flush purge in operation 104. Generally, a purge removes a vapor phase reactant from a process chamber and typically occurs only after delivery of such reactant is completed. In other words, that reactant is no longer delivered to the reaction chamber during the purge. However, the reactant remains adsorbed on the substrate surface during the purge. Typically, the purge serves to remove any residual vapor phase reactant in the chamber after the reactant is adsorbed on the substrate surface to the desired level purge may also remove weakly adsorbed species (e.g., certain precursor ligands or reaction by-products) from the substrate surface. In ALD, the purge may prevent gas phase interaction of two reactants or interaction of one reactant with a thermal or other driving force for the surface reaction. The purge may also flow a fluid volume through the chamber several times the volume of the chamber to reduce the amount of residual vapor phase reactant remaining in the chamber. The purge phases described herein involve flowing of an inert gas such as argon (Ar), xenon (Xe), helium (He), or nitrogen (N) to the process chamber. A rapid flush purge is explained further below.

In operation 106, a reactant B is introduced to the chamber. Reactant B may be a metal-containing precursor, for example, or a reducing agent or other co-reactant. Reactant B may react with the adsorbed species of reactant A to form at least a sub-monolayer of film, Reactant B and the adsorbed species of reactant A may also create a vapor phase product.

After operation 106, the process chamber is purged operation 108 by a rapid flush purge. Similar to operation 104, a purge removes vapor phase reactant B as well as any vapor phase product created by the reaction of reactant B with adsorbed reactant A from the process chamber by flowing an inert gas such as argon to the process chamber.

The result of operations 102-108 is the formation of at least a sub-monolayer of film. For example, a film of tungsten may be formed. Operations 102-408 comprise a single ALD cycle and may be repeated one or more times to increase the thickness of the film. Each ALD cycle will deposit additional material, creating a substantially uniform layer of film. In some embodiments, the film composition may include undesired compounds, for example fluorine. The presence of undesired chemicals in the film may affect the properties of the film, such as resistivity.

In FIG. 1 both of operations 104 and 108 are rapid flush purges. A rapid flush purge flows purge gas into the chamber using two accumulators flowed sequentially. An accumulator may be any container or volume capable of storing a pressurized volume of purge gas, for example about 50 cc to about 1 liter, or about 300 cc. In some embodiments, only one of operatims 104 and 108 is a rapid flush purge, while the other is a purge by a different method such as continuous flow or using a single accumulator. In some embodiments, a rapid flush purge can be used for a single reactant ALD cycle, where operations 102 and 104 are repeated using a single reactant and a single purge operation.

Figure 2A:
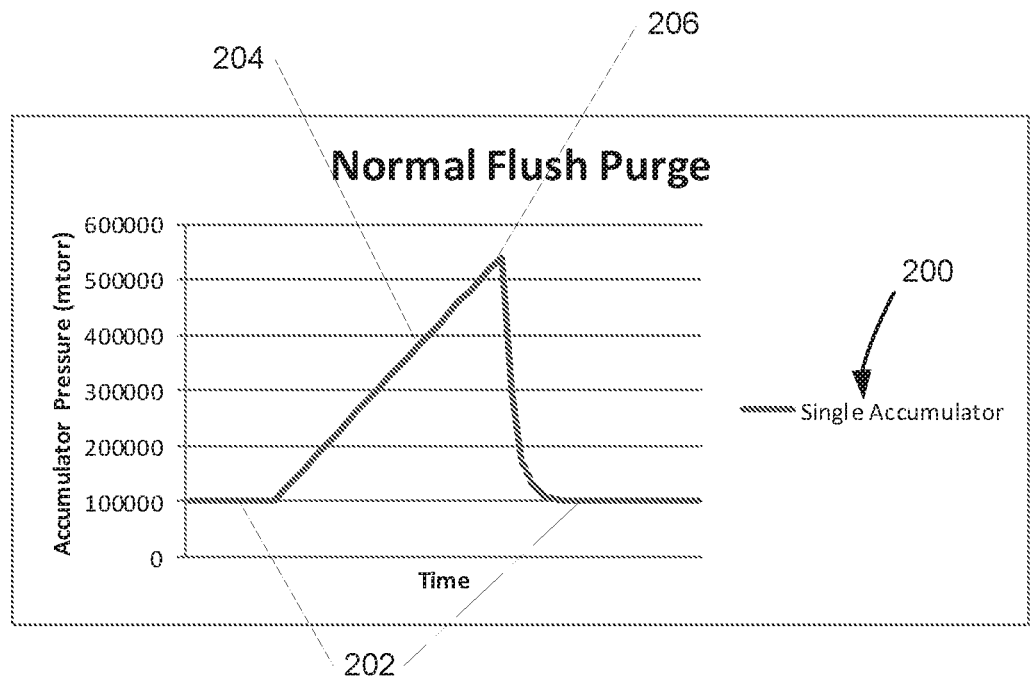
FIGS. 2A and 2B presents a pressure time graph for a disclosed embodiment.
Figure 2B:
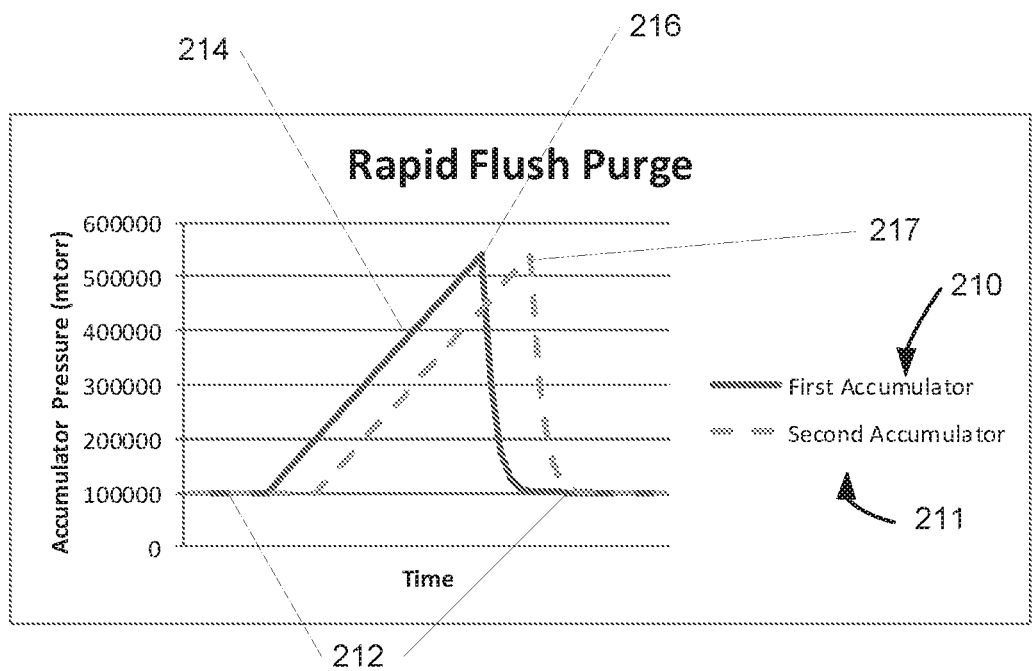

FIGS. 2A and 2B represent the pressure of a volume in one or more accumulators as a function of time for two different ways of performing a purge operation. In FIG. 2A, an accumulator 200 is used to build a pressurized volume of purge gas, which is then flowed into the process chamber. Accumulator 200 has an initial pressure 202, which acts as a baseline pressure of the accumulator. Slope 204 shows the increase in pressure of the volume in the accumulator 200 as the purge gas is pressurized. In FIG. 2A the accumulator reaches a maximum pressure of about 550 Torr before the purge gas is flowed to the chamber, but the pressure in the accumulator may vary from about 400 Torr to about 1000 Torr. Then, at time 206 the purge gas is flowed into the chamber, and the pressure rapidly decreases as purge gas flows out of the accumulator 200. The decrease in pressure of the accumulator 200 corresponds with an increased flow of purge gas into the chamber. As the purge volume is flowed into the chamber, the pressure in the accumulator 200 returns to baseline value 202. The accumulator may then increase pressure and flow purge gas into the chamber for a second purge step (not shown).

FIG. 2B represents a rapid flush purge. A first accumulator 210 and a second accumulator 211 are used to flow purge gas into the chamber. Similar to FIG. 2A, both accumulators have a baseline pressure 212. Then, the first accumulator 210 is pressurized as shown by slope 214. At time 216 the purge gas from the first accumulator is flowed into the chamber, resulting in a rapid decrease in pressure in the first accumulator. The decrease in pressure of the accumulator corresponds with an increased mass flow of purge gas into the chamber. As the pressure in the first accumulator decreases, the mass flow of purge gas into the chamber will also decrease. Then, at time 217, the second accumulator 211 flows purge gas into the chamber. The second flow of pressurized purge gas again increases the mass flow of purge gas into the chamber. By using two accumulators, the average mass flow into the chamber is increased, increasing the rate of removal of reactant gases, and decreasing the total time required to purge the chamber. In some embodiments, additional accumulators may be used to continuously maintain a high pressure flow of purge gas into the chamber, flowing purge gas from any number of additional accumulators in a similar manner as the second accumulator. In some embodiments, each accumulator is pressurized and purge gas flowed into the chamber multiple times during a single rapid flush purge operation, for example the first accumulator flowing purge gas into the chamber two or more times during a single purge operation. In some embodiments additional accumulators or repeated flows from the same accumulators may be useful for large chambers, or where the volume of each accumulator is smaller than 300 cc. As noted above, the pressure in the first and the second accumulator is about 550 Torr, but in various embodiments the pressure may vary from about 400 Torr to about 1000 Torr. The pressure between the first and the second accumulator may also vary, where the first accumulator has a pressure between about 400 Torr and about 1000 Torr, and the second accumulator has a different pressure between about 400 Torr and about 1000 Torr.

The timing of flowing of purge gas from the first and second accumulator may vary across embodiments. In some embodiments, the second accumulator is flowed before the pressure of the first accumulator returns to baseline 212. In other embodiments, the second accumulator may be flowed as the first accumulator returns to the baseline pressure or after the first accumulator has returned to the baseline pressure. In some embodiments the second accumulator is simply flowed after the first accumulator, without regard to the pressure of the first accumulator. In some embodiments the second accumulator is flowed within 5 seconds, 3 seconds, 1 second, 0.5 seconds, or 0.1 seconds of flowing the first accumulator.

The flow of purge gas from an accumulator may be a choked flow. Choked flow may occur if the pressure ratio between a high pressure environment and a low pressure environment is great enough. The velocity of fluid flow will not increase with a further decrease in pressure of the low pressure environment, and the flow is considered choked. The minimum pressure ratio for choked flow depends on the particular gases used, though generally is around 2:1. Choked flow can be modeled using only the conditions of the high pressure environment, including temperature, pressure, and gas density, which may be desirable when the parameters of the low pressure environment are unknown or changing. Specifically, when purging a process chamber, choked flow is relevant as a factor to reduce the time required to sufficiently purge the chamber.

During an ALD process, example chamber pressure ranges are about 3 torr-100 torr, about 3 torr-40 torr, or about 3 torr-10 torr. Meanwhile, the pressure of an accumulator for a purge step may be about 400 torr to 1000 torr. Thus, the initial flow of purge gas into the chamber from an accumulator is typically choked. However, as can be seen from FIG. 2B, the pressure in the accumulator will rapidly decay. The flow may become unchoked as the pressure ratio between the accumulator and the process chamber decreases. This would decrease the velocity and mass flow of purge gas into the chamber, increasing the time required to purge. By flowing purge gas from the second accumulator 211 as shown in FIG. 2B, the flow will remain choked, and the chamber will require less time to be purged. The timing of flowing purge gas from the second accumulator may vary among embodiments, where in some embodiments the purge gas from the second accumulator is flowed while the flow of purge gas into the chamber is choked. In other embodiments the purge gas from the second accumulator may be flowed after the flow of purge gas into the chamber stops being choked. In such cases flowing purge gas from the second accumulator may cause the flow of purge gas into the chamber to become choked.

According of various embodiments, using a rapid flush purge can result in lower stress of the deposited material, lower content of impurities such as fluorine, reduced cycle time for deposition, and improved purge efficiency. For example, when filling complicated features such as wordlines of a 3D NAND structure, rapid flush purging maintains fill quality with reduced cycle time and improved film properties.

Figure 3A:
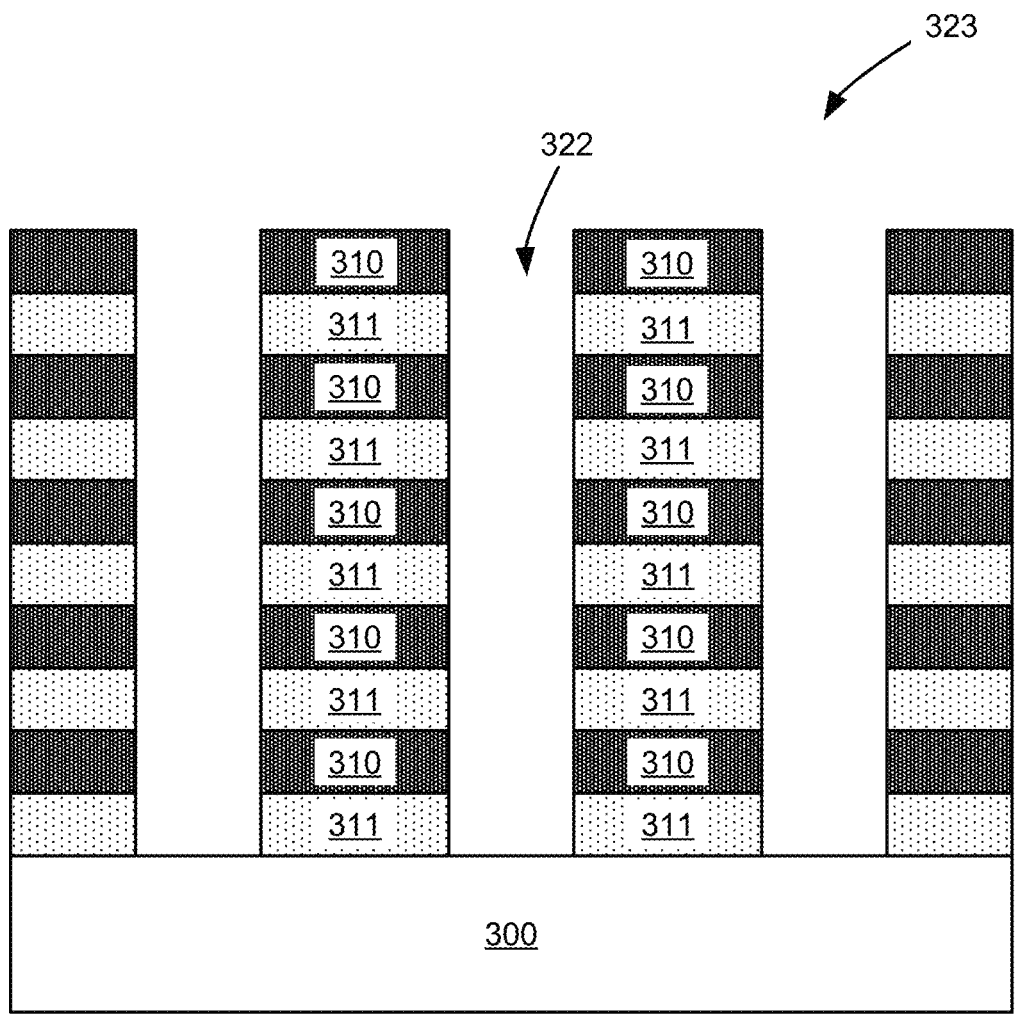
FIGS. 3A-3C present illustrations of 3D NAND structures that may be filled using embodiments of the methods described herein.
Figure 3B:
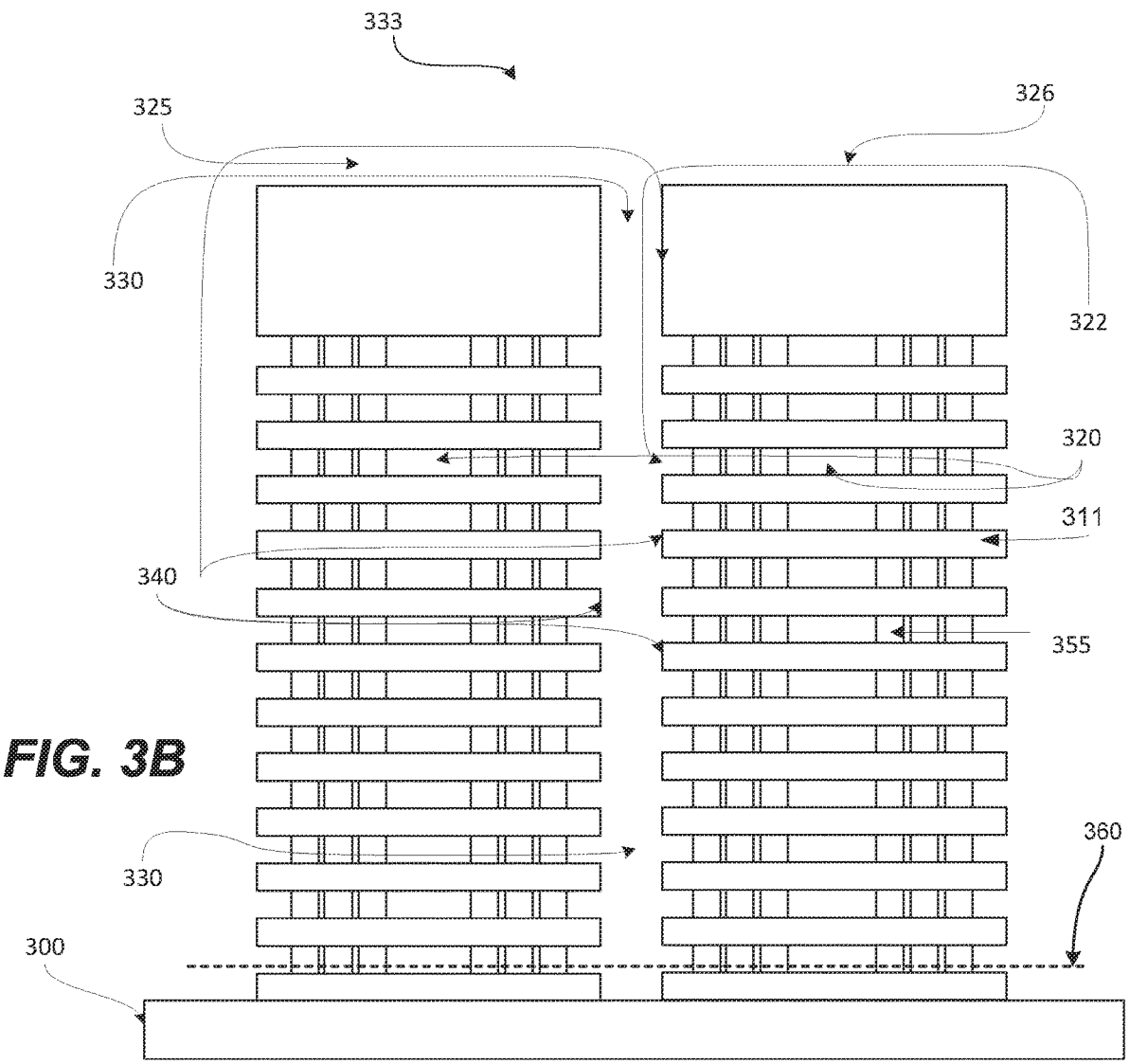

FIG. 3A depicts a schematic example of wordlines 310 in a 3D NAND structure 323 formed on a substrate 300. The wordlines 310 are separated by oxide layers 311. FIG. 3B presents a cross-sectional side view of a partially fabricated 3-D NAND structure 333 and illustrates challenges of metal fill. The structure 330 is formed on a semiconductor substrate 300 and includes 3D NAND stacks (left 325 and right 326), central vertical structure 330, and a plurality of stacked wordline features 320 with openings 322 on opposite sidewalls 340 of central vertical structure 330. Note that FIG. 3B displays two stacks 325 and 326 of the exhibited partially fabricated 3-D NAND structure 333, which together form the trench-like central vertical structure 330, however, in certain embodiments, there may be more than two stacks arranged in sequence and running spatially parallel to one another, the gap between each adjacent pair of stacks forming a central vertical structure 330, like that explicitly illustrated in FIG. 3B. In the example of FIG. 3B, the wordline features 320 are fluidically accessible from the central vertical structure 330 through the openings 322. Although not explicitly indicated in the figure, the horizontal features 320 present in both the 3-D NAND stacks 325 and 326 shown in FIG. 3B (i.e., the left 3-D NAND stack 325 and the right 3-D NAND stack 326) are also accessible from the other sides of the stacks (far left and far right, respectively) through similar vertical structures formed by additional 3-D NAND stacks (to the far left and far right, but not shown). In other words, each 3-D NAND stack 325, 326 contains a stack of wordline features that are fluidically accessible from both sides of the 3-D NAND stack through a central vertical structure 330.

The wordline features in a 3-D NAND stack may be formed by depositing an alternating stack of silicon oxide and silicon nitride layers, and then selectively removing the nitride layers leaving a stack of oxide layers 311 having gaps between them. These gaps are the wordline features 320. Any number of wordlines may be vertically stacked in such a 3-D NAND structure so long as there is a technique for forming them available, as well as a technique available to successfully accomplish substantially void-free fills of the vertical features. Thus, for example, a 3D-NAND stack may include between 2 and 256 horizontal wordline features, or between 8 and 128 horizontal wordline features, or between 16 and 64 horizontal wordline features, and so forth (the listed ranges understood to include the recited end points).

Figure 3C:
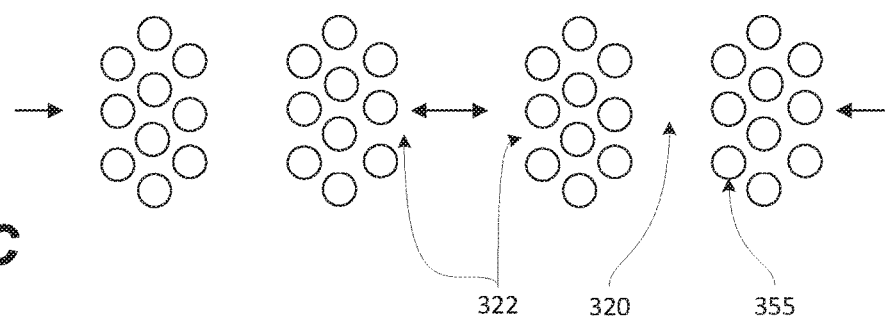

FIG. 3C presents a cross-sectional top-down view of the same 3-D NAND structure shown in FIG. 3B with the cross-section taken through the horizontal section 360 as indicated by the dashed horizontal line in FIG. 3B. The cross-section of FIG. 3B illustrates several rows of pillars 355, which are run vertically from the base of semiconductor substrate 300 to the top of the 3-1) NAND stacks. In some embodiments, these pillars 355 are formed from a polysilicon material and are structurally and functionally significant to the 3-D NAND structure 333. In some embodiments, such polysilicon pillars may serve as gate electrodes for stacked memory cells formed within the pillars. The top-view of FIG. 3C illustrates that the pillars 355 form constrictions in the openings 322 to wordline features 320—i.e, fluidic accessibility of wordline features 320 from the central vertical structure 330 via openings 3:22 (as indicated by the arrows in FIG. 3C) is inhibited by pillars 355. In some embodiments, the size of the horizontal gap between adjacent polysilicon pillars is between about 1 and 20 nm. This reduction in fluidic accessibility increases the difficulty of uniformly filling wordline features 320 with conductive material.

Figure 4A:
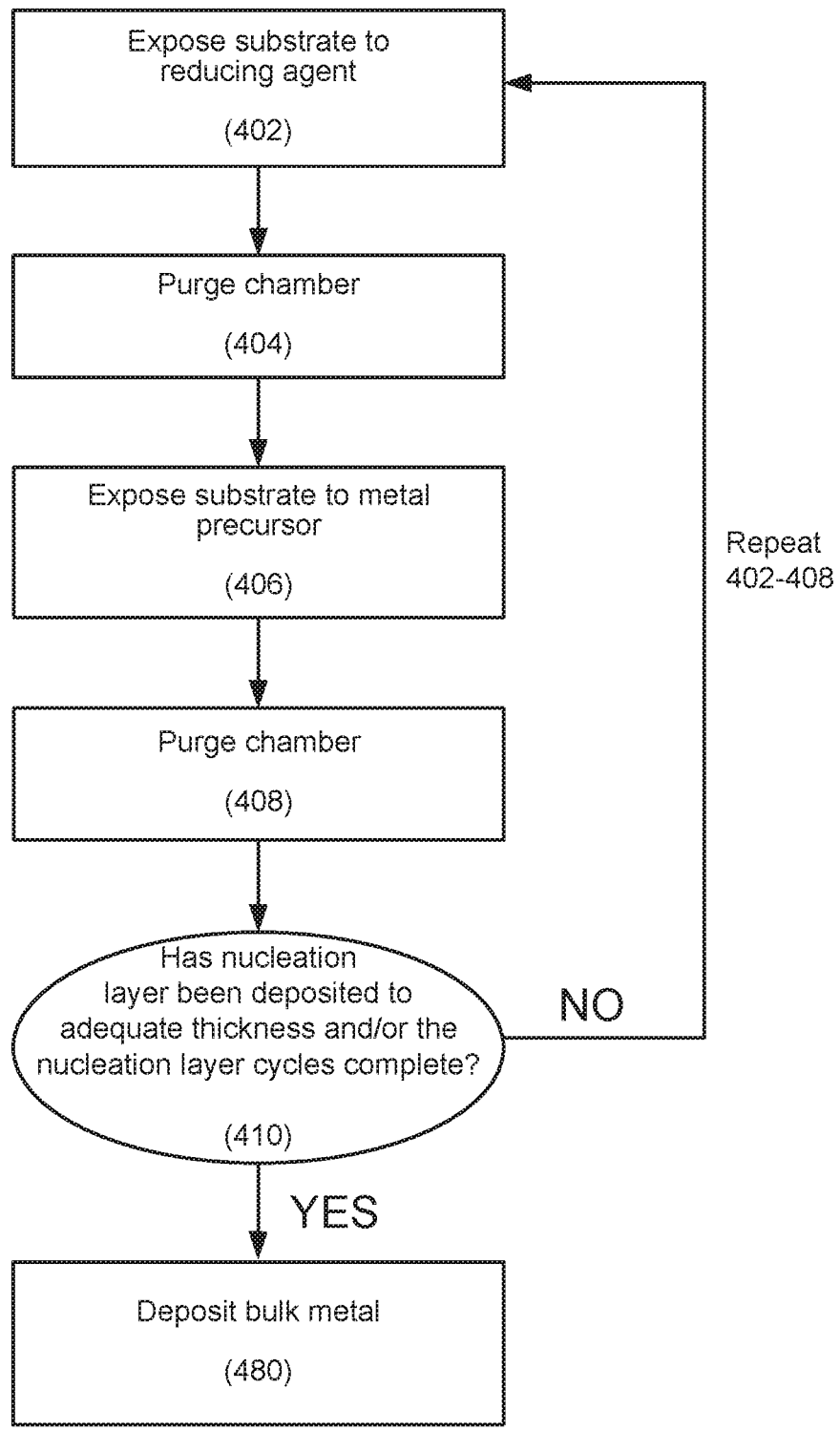
FIGS. 4A and 4B present flow diagrams of an operation for an example embodiment.
Figure 4B:
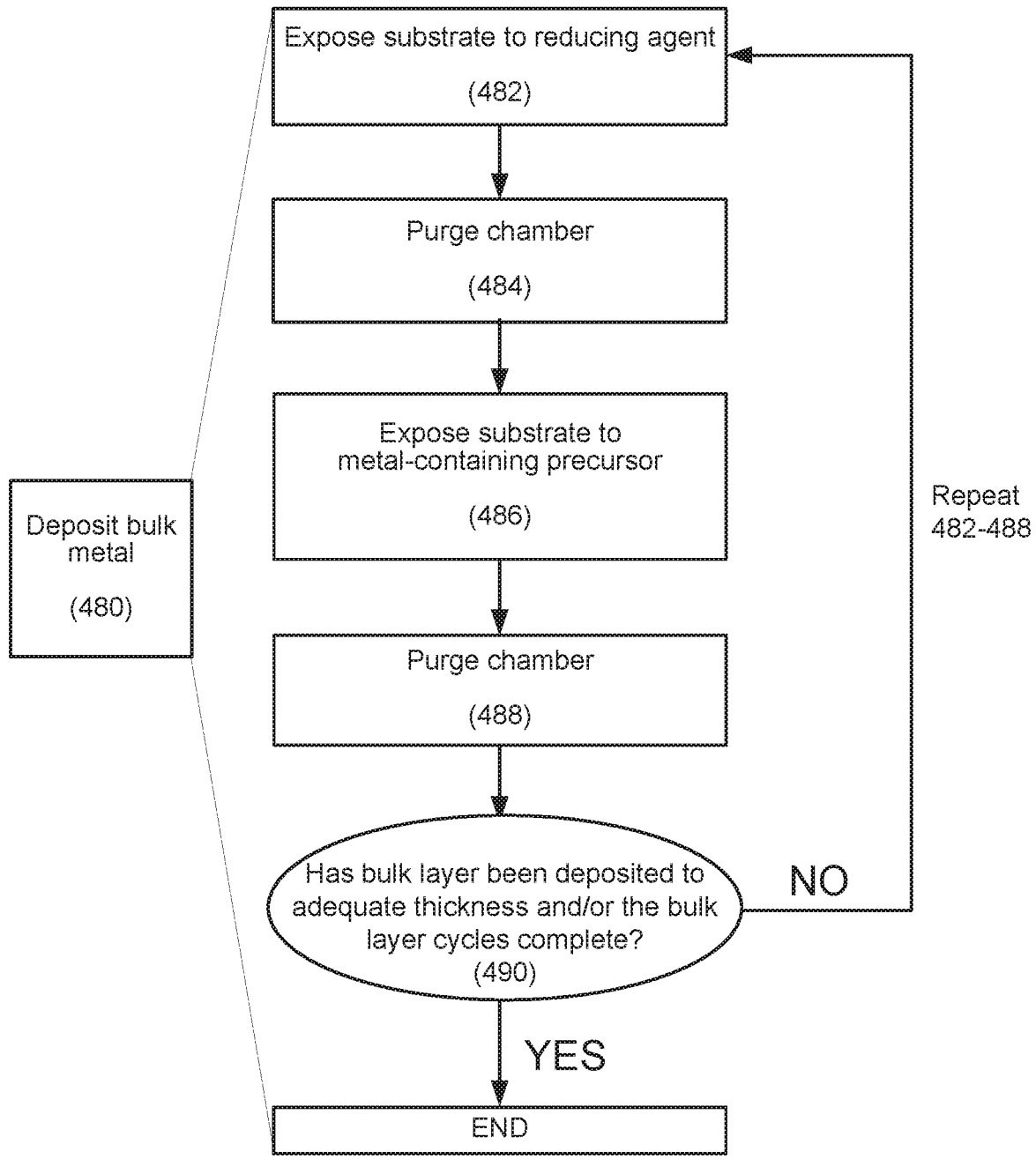

FIGS. 4A-4C describe methods that may be performed to fill a 3D NAND structure with metal. Turning first to FIG. 4A, operations 402-410 of FIG. 4A are performed to deposit a nucleation layer by ALD, In some embodiments described herein, operations 402-410 are performed at lower pressure than the subsequent bulk deposition in operation 480. For example, operations 402-410 may be performed at a low pressure less than about 10 Torr. In some examples, operations 402-410 are performed at a pressure of about 10 Torn or a pressure of about 3 Torr.

In operation 402, the substrate is exposed to a metal-containing precursor. This operation may be referred to as a "pulse" or a "dose," which may be used interchangeably herein. The metal-containing precursor contains a metal that will be the main component of the nucleation layer, and in many embodiments (though not necessarily), the subsequently deposited bulk layer.

Examples of nucleation layers include tungsten-containing nucleation layers and molybdenum-containing nucleation layers, which use tungsten-containing precursors and molybdenum-containing precursors, respectively. Examples of tungsten-containing precursors include tungsten halides and tungsten oxyhalides. Examples of tungsten halides include tungsten hexafluoride ($WF_6$), tungsten chlorides ($WCl_x$) including tungsten hexachloride ($WCl_6$), tungsten pentachloride ($WCl_5$), tungsten tetrachloride ($WCl_4$), tungsten dichloride ($WCl_2$), and tungsten oxychlorides ($WO_xCl_y$) such as tungsten oxytetrachloride ($WOCl_4$) and tungsten dichloride dioxide ($WO_2Cl_2$). Further examples include tungsten hexacarbonyl $W(CO)_6$ and organo-tungsten precursors such as MDNOW (methylcyclopentadienyl-dicarbonylnitrosyl-tungsten) and EDNOW (ethylcyclopentadienyl-dicarbonylnitrosyl-tungsten).

Examples of molybdenum-containing precursors include molybdenum halides and molybdenum oxyhalides. Examples of molybdenum halides include molybdenum pentachloride ($MoCl_5$) and molybdenum hexafluoride ($MoF_6$). Examples of molybdenum oxyhalides include molybdenum dichloride dioxide ($MoO_2Cl_2$), molybdenum oxytetrachloride ($MoOCl_4$), and molybdenum oxytetrachloride ($MoOF_4$).

The metal-containing precursor may include a combination of these compounds. In some embodiments, a carrier gas, such as nitrogen ($N_2$), argon (Ar), helium (He), or other inert gases, may be flowed during operation 402.

Operation 402 may be performed for any suitable duration and at any suitable temperature. In some examples, operation 402 may be performed for a duration between about 0.25 seconds and about 30 seconds, about 0.25 seconds to about 5 seconds, or about 0.5 seconds to about 3 seconds. This operation may be performed in some embodiments for a duration sufficient to saturate the active sites on the surface of the substrate.

In operation 404, the chamber is purged to remove excess precursor that did not adsorb to the surface of the substrate. A purge may be conducted as a rapid flush purge with two or more accumulators, as described above. A purge gas may be flowed into the chamber from a first accumulator with a pressure higher than the chamber pressure, followed by flowing additional purge gas into the chamber from a second accumulator. Operation 404 may be performed for any suitable duration. Example durations include between about 0.5 seconds and about 25 seconds or about 0.5 seconds and about 5 seconds. The purge gas from the second accumulator may be flowed about 2 seconds, about 1 seconds, or about 0.5 seconds after flowing purge gas from the first accumulator. After the purge gas is flowed from each accumulator, the chamber may be re-pressurized.

In operation 406, the substrate is exposed to a co-reactant to deposit a nucleation layer, in some embodiments, the co-reactant is a reducing agent such as hydrogen ($H_2$), borane, silane, or germane. Example boranes include borane ($BH_3$), diborane ($B_2H_6$), triborane, alkyl boranes, aminoboranes, carhoboranes, and haloborane. Example silanes include silane ($SiH_4$), disilane ($Si_2H_6$), trisilane ($Si_3H_8$), alkyl silanes, aminosilanes, carbosilanes, and halosilane. Germanes include $Ge_nH_{n+4}$, $Ge_nH_{n+6}$, $Ge_nH_{n+8}$, and $Ge_nH_m$, where n is an integer from 1 to 10, and n is a different integer than m. Other germanes may also be used, e.g., alkyl germanes, aminogermanes, carbogermanes, and halogermanes. In general, halogermanes may not have significant reducing potential but there may be process conditions and precursors suitable for film formation using halogermanes.

In some embodiments, an amorphous nucleation layer may be deposited using a metal halide or metal oxyhalide precursor and a nitrogen-containing reducing agent such as ammonia ($NH_3$). Such nucleation layers are described in U.S. Provisional Patent Application No. 62/797,860 filed Jan. 28, 2019 and may be characterized as metal oxynitride or metal nitride nucleation layers. The metal oxynitride or metal nitride nucleation layers may be converted to metal layers in subsequent processing including during deposition of a bulk layer.

Operation 406 may be performed for any suitable duration. Example durations include between about 0.25 seconds and about 30 seconds, about 0.25 seconds to about 5 seconds, or about 0.5 seconds to about 3 seconds. In some embodiments, this operation may be sufficient to react with the adsorbed layer of metal-containing precursor on the surface of the substrate. Operation 406 may be performed for a duration outside of these example ranges. In some embodiments, a carrier gas may be used, such as, for example, argon (Ar), helium (He), or nitrogen ($N_2$).

After operation 408, there is a purge step to purge excess co-reactant still in gas phase that did not react with the metal-containing precursor on the surface of the feature. A purge may be conducted as a rapid flush purge with two or more accumulators, as described above. A purge gas may be flowed into the chamber from a first accumulator with a pressure higher than the chamber pressure, followed by flowing additional purge gas into the chamber from a second accumulator. Operation 404 may be performed for any suitable duration. Example durations include between about 0.5 seconds and about 25 seconds or about 0.5 seconds and about 5 seconds. The purge gas from the second accumulator may be flowed about 2 seconds, about 1 seconds, or about 0.5 seconds after flowing purge gas from the first accumulator. After the purge gas is flowed from each accumulator, the chamber may be re-pressurized.

Each repetition of operations 402-408 may be referred to as an ALD cycle. It will be appreciated that the order of operations 402 and 406 may be reversed, such that co-reactant is introduced first in a particular cycle with purges optionally separating the metal-containing precursor and co-reactant doses. In operation 410, it is determined whether the nucleation layer has been deposited to an adequate thickness or to a preset number of cycles. If not, operations 402-408 are repeated.

After the nucleation layer is deposited to an adequate thickness, in operation 480, bulk metal is deposited as described below. In various embodiments, operation 480 may be performed at a pressure greater than the pressure during operations 402-410. For example, operation 480 may be performed at a pressure greater than or equal to about 3 Torr, for example about 10 Torr, about 40 Torr, or about 100 Torr. In some embodiments, the pressure during both the nucleation layer and bulk layer deposition may be about 3-40 Torr, or 10 Torr. In other embodiments, the same pressure may be used and/or a lower pressure may be used in operation 480.

FIG. 4B provides a process flow diagram for operations that may be performed during operation 480. Note that operations of FIG. 4B may be performed without performing operations of FIG. 4A. That is, in some embodiments, the method of FIG. 4B may be performed without first depositing a nucleation layer.

In FIG. 4B, in operation 482, the substrate is exposed to a co-reactant. In some embodiments, this is a reducing agent, such as $H_2$, which may be pulsed without another reactant. While the co-reactant pulse is described as being the first pulse in the cycle defined by operations 482-488, in some embodiments, the order of operations 482 and 486 may be reversed such that the metal-containing precursor may be first. Operation 482 may involve adsorption of $H_2$ molecules on the surface and/or reaction with metal-containing precursor molecules to form a monolayer of sub-monolayer of film.

In some embodiments, a carrier gas may be flowed. The carrier gas may be any of those described above with respect to operation 404 in FIG. 4A. Operation 482 may be performed for any suitable duration. In some examples, Example durations include between about 0.25 seconds and about 30 seconds, about 0.25 seconds to about 5 seconds, or about 0.5 seconds to about 3 seconds.

Returning to FIG. 4B, in operation 484, the chamber is purged. This purge operation may remove excess co-reactant that remained in gas phase. As described above, a purge may conducted by a rapid flush purge, followed by re-pressurizing the chamber before initiating another gas exposure. The chamber may be purged for any suitable duration, for example, for a duration between about 0.1 seconds and about 3 seconds. In operation 486, the substrate is exposed to a metal-containing precursor. This may form a submonolayer or monolayer of film on the substrate. In various embodiments, the metal-containing precursor is flowed to the chamber during this operation for a duration between about 0.1 seconds and about 3 seconds, or about 0.5 seconds. In some embodiments, the metal-containing precursor may be diverted to fill the gas line and line change before dosing.

Examples of metal precursors include $WF_6$, $WCl_x$ including $WCl_6$, $WCl_5$, $WCl_4$, $WCl_2$, and $WO_xCl_y$ such as $WOCl_4$ and $WO_2Cl_2$. Further examples include $W(CO)_6$ and MDNOW and EDNOW. Further examples include molybdenum-containing precursors such as molybdenum halides and molybdenum oxyhalides. Examples of molybdenum halides include $MoCl_5$ and $MoCl_6$. Examples of molybdenum oxyhalides include $MoO_2Cl_2$ and $MoOCl_4$.

In operation 488 of FIG. 4B, the chamber is purged to remove reacted byproducts and gas phase metal-containing precursor from the chamber. The purge may be a rapid flush purge as described above. In some embodiments, the purge duration is between about 0.1 seconds and about 2 seconds.

In operation 490 of FIG. 4B, it is determined whether bulk metal has been deposited to an adequate thickness or a preset number of cycles is complete. If not, operations 482-488 are repeated until a desired thickness is deposited. In some embodiments, operations 482-488 are repeated until a feature is filled.

The metal-containing precursor used in operation 480 may be the same or different than the one used for nucleation layer deposition. If different, it may contain the same or a different metal, e.g., a tungsten bulk layer may be deposited on a tungsten nucleation layer in some embodiments or on a molybdenum nucleation layer in some embodiments.

Example

The following example is provided to further illustrate aspects of various embodiments. This example is provided to exemplify and more clearly illustrate aspects and is not intended to be limiting. The following tables illustrate various aspects of ALD tungsten deposition using embodiments disclosed herein.

Table 1 and Table 2 below are timing diagrams for deposition of a nucleation layer of tungsten without a rapid flush purge and with a rapid flush purge, respectively. Divert represents flowing the reactants somewhere other than the chamber, for example a low pressure container. LC stands for line charge, which refers to building pressure in an accumulator that provides gas to the chamber. In some embodiments each gas, including reactant and purge gases, has its own accumulator. Dose represents flowing the reactants on the left side of the table, diborane/silane or $WF_6$, into the chamber. Purge represents flowing purge gas into the chamber. Vertically aligned processes represent that both operations occur simultaneously.

The total time for a single ALD cycle for a nucleation layer without a rapid flush purge is 54 seconds, 39 of which consist of purging the chamber. In contrast, a single ALD cycle with a rapid flush purge as described herein takes 25 seconds, which is a 54% improvement in the cycle time for depositing a sub-monolayer. Using a rapid flush purge requires only 10 seconds each ALD cycle, a large improvement over not using a rapid flush purge.

TABLE 1

Timing diagram for tungsten deposition without a rapid flush purge.

| $B_2H_6$/$SiH_4$ | Step type | Divert | LC | Dose | Purge | | | Divert | LC | Dose | Purge | |
|---|---|---|---|---|---|---|---|---|---|---|---|---|
| | Time (s) | 0 | 9 | 5 | 4.5 | 0 | 4.5 | 0 | 9 | 5 | 4.5 | 0 | 4.5 |
| $WF_6$ | Step type | | | | Divert | LC | Dose | Purge | | | Divert | LC | Dose | Purge |
| | Time (s) | | | | 0 | 4.5 | 10 | 21 | 0 | 9 | 0 | 4.5 | 10 | 30 |

TABLE 2

Timing diagram for tungsten deposition using a rapid flush purge.

| $B_2H_6$/$SiH_4$ | Step type | Divert | LC | Dose | Purge | | | Divert | LC | Dose | Purge | |
|---|---|---|---|---|---|---|---|---|---|---|---|---|
| | Time (s) | 0 | 5 | 5 | 0.5 | 0 | 4.5 | 0 | 5 | 5 | 0.5 | 0 | 4.5 |
| $WF_6$ | Step type | | | | Divert | LC | Dose | Purge | | | Divert | LC | Dose | Purge |
| | Time (s) | | | | 0 | 4.5 | 10 | 0 | 0 | 5 | 0 | 4.5 | 10 | 5 |

Table 3 is a flow diagram for embodiments where a rapid flush purge involves flowing purge gas from two accumulators multiple times during a single purge operation. Following an $H_2$ dose or a $WF_6$ dose, purge gas may be flowed from a first accumulator, followed by a second accumulator, and then again flowed from the first accumulator and the second accumulator. Each accumulator may be used to provide a dose of purge gas multiple times before the next reactant is flowed into the chamber. In some embodiments the accumulators are cycled to repeatedly flow purge gas into the chamber. In some embodiments purge gas is flowed from one accumulator n times and purge gas is flowed from another accumulator m times, where n may or may not equal m.

TABLE 3

Flow diagram for tungsten deposition using multiple doses from each accumulator for a rapid flush purge.

| Bulk $H_2$ Dose | $H_2$ Purge | | $WF_6$ Dose | $WF_6$ Purge | | $H_2$ Dose | $H_2$ Purge | | $WF_6$ Dose | $WF_6$ Purge | |
|---|---|---|---|---|---|---|---|---|---|---|---|
| | AR2 Dose | AR1 Dose | | AR2 Dose | AR1 Dose | | AR2 Dose | AR1 Dose | | AR2 Dose | AR1 Dose |
| | Repeat "n" times | | | Repeat "n" times | | | Repeat "n" times | | | Repeat "n" times | |

Table 4 shows a comparison of material properties of tungsten where the nucleation layer was deposited using a rapid flush purge and not using a rapid flush purge. The timings of each deposition process are the same as shown in tables 1 and 2 above. In both nucleation deposition processes the reactant gases were also pressurized using a different accumulator with each reactant gas. The nucleation layer deposition were different for the rapid flush purge process and the non-rapid flush purge process, while the bulk layer deposition process was the same for both, and did not use a rapid flush purge. Argon is used as the purge gas. The ALD cycle for the nucleation layer was repeated 5 times, while the bulk layer deposition cycle was repeated 1200 times. As shown in the table, the tungsten deposited using a rapid flush purge resulted in lower resistivity, increased stress, and increased thickness, all in a reduced time frame for deposition. Ar1 and Ar2 refer to flowing gas from a first or second accumulator, respectively.

TABLE 4

Process conditions and material properties of deposited film where nucleation process changed and bulk process remained the same.

| | | Without Rapid Flush Purge | With Rapid Flush Purge |
|---|---|---|---|
| Nucleation | Process | 275 C. 5x $B_2H_6$—$SiH_4$—$WF_6$ | 275 C. 5x $B_2H_6$—$SiH_4$—$WF_6$ |
| | $B_2H_6$/$SiH_4$ timing(s) Divert/LC/Dose/Purge | 0/9/5/9 | 0/5/5/5 |
| | $WF_6$ timing(s) Divert/LC/Dose/Purge | 0/4.5/10/30 | 0/4.5/5/5 |
| | $B_2H_6$/$SiH_4$/Ar/$WF_6$ flows (sccm) | 450/450/900/1350 | 810/810/1620/1350 |
| Bulk | Process | 430 C. ($H_2$—Ar2—$WF_6$—Ar1) | 430 C. ($H_2$—Ar2—$WF_6$—Ar1) |
| | Cycle time(s) | 0.77 | 0.77 |
| | #cycles | 1200 | 1200 |
| Resistivity (µOhm-cm) | | 20.6 | 19.5 |
| Stress (MPa) | | −207.6 | −262.1 |
| Thickness(Å) | | 187.1 | 195.5 |

Table 5 demonstrates a comparison of material properties of deposited tungsten where the nucleation layer process remained the same, but the bulk layer process changed as shown. The 0.9 second rapid flush bulk ALD process used a rapid flush purge after flowing hydrogen into the processing chamber, while the 1.1 second rapid flush purge used a rapid flush purge after flowing hydrogen as well as after flowing tungsten precursor into the processing chamber. Ar1 and Ar2 refer to a first and second accumulator, respectively. Each ALD cycle of the bulk process took 0.77 s, 0.9 s, or 1.1 s per cycle. The resulting stress, fluorine level, and void percent of each film demonstrate that using a rapid flush process as described herein decreases each of those properties of the deposited film, all of which are desirable.

TABLE 5

Process conditions and material properties of deposited film where bulk process changed and nucleation process remained the same.

| | Non Rapid Flush | 0.9 s Rapid Flush | 1.1 s Rapid Flush |
|---|---|---|---|
| Bulk Process | 300 C. $H_2$—Ar1—$WF_6$—Ar1 0.1/0.15/0.25/0.25 (s) Ar1 = 10,000 sccm | 300 C. $H_2$—Ar1—Ar2—$WF_6$—Ar1 0.15/0.2/0.2/0.15/0.2 (s) Ar1=Ar2 = 10,000sccm | 300 C. $H_2$—Ar2—Ar1—$WF_6$—Ar2—Ar1 0.15/0.2/0.2/0.15/0.2/0.2 (s) Ar1=Ar2 = 10,000sccm |
| Bulk Cycle Time | 0.77 s | 0.9 s | 1.1 s |
| Bulk Dep Rate | 0.144 Å/cycle | 0.152 Å/cycle | 0.152 Å/cycle |
| Stress @200 Å | 610 MPa | 332 MPa | 275 MPa |
| Bulk F Level | $3.9e18\ cm^{-3}$ | $3.2e18\ cm^{-3}$ | $2.8e18\ cm^{-3}$ |
| Void Percent | 16.5% | 12.6% | 14.9%' |

Apparatus

Any suitable chamber may be used to implement the disclosed embodiments. Example deposition apparatuses include various systems, e.g., ALTUS® and ALTUS® Max. available from Lam Research Corp., of Fremont, California, or any of a variety of other commercially available processing systems. In some embodiments, atomic layer deposition (ALD) may be performed at a first station that is one of two, five, or even more deposition stations positioned within a single deposition chamber. Thus, for example, hydrogen ($H_2$) and tungsten hexafluoride ($WF_6$) or other metal-containing precursor may be introduced in alternating pulses to the surface of the semiconductor substrate, at the first station, using an individual gas supply system that creates a localized atmosphere at the substrate surface. Another station may be used for tungsten bulk layer deposition. Two or more stations may be used to deposit tungsten in parallel processing. Alternatively a wafer may be indexed to have operations performed over two or more stations sequentially.

Figure 5:
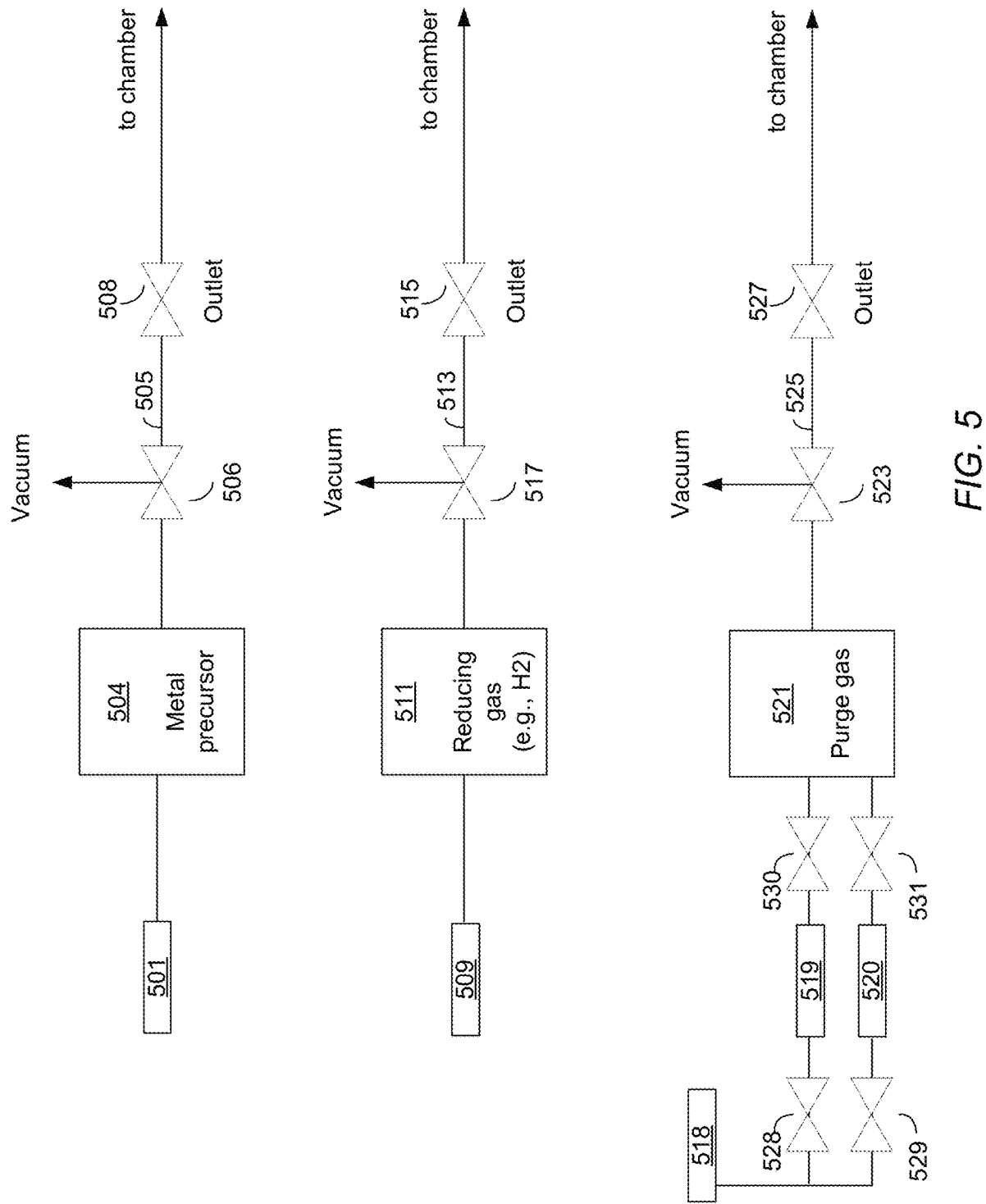
FIG. 5 is an illustration of fluidic connections for an example embodiment.

The apparatus may include a gas manifold system, which provides line charges to the various gas distribution lines as shown schematically in FIG. 5. Manifold 504 has inputs from a source 501 of a metal-containing precursor gas, which may include an accumulator (not shown). Manifold 511 has an input 509 from a source of hydrogen ($H_2$) or other reducing gas (not shown), which may include an accumulator (not shown). As described above, there may or may not be an input from a carrier gas to manifold 511. Manifold 521 has an input from a first accumulator 519 and a second accumulator 520. The first accumulator 519 and the second accumulator 520 have inputs from a source of inert purge gas 518. The manifolds 504, 511 and 521 provide the metal-containing precursor gas, co-reactant gas, and purge gas to the deposition chamber through valved distribution lines, 505, 513 and 525 respectively. The various valves may be opened or closed to provide a line charge, i.e., to pressurize the distribution lines. For example, to pressurize distribution line 505, valve 506 is closed to vacuum and valve 508 is closed. After a suitable increment of time, valve 508 is opened and the co-flow gas is delivered to the chamber. After a suitable time for delivery of the gas, valve 508 is closed. The chamber can then be purged to a vacuum by opening of valve 506 to vacuum.

Similar processes can be used to deliver the reducing gas. To introduce the reducing gas, for example, distribution line 513 is charged by closing valve 515 and closing valve 517 to vacuum. Opening of valve 515 allows for delivery of the reducing gas to the chamber.

Similarly, to introduce the purge gas, distribution line 525 is charged by closing valve 527 and closing valve 523 to vacuum. Opening of valve 527 allows for delivery of the argon or other inert purge gas to the chamber. Valves 528 and 530 may be opened or closed to introduce purge gas from the source of inert purge gas 518 to the accumulators 519 and 520. The amount of time allowed for line charges changes the amount and timing of the initial delivery of the gas. Valves 530 and 531 may be opened or closed to introduce purge gas from accumulators 519 and 520, respectively. Opening valve 530 and/or valve 531 changes the amount and timing of the delivery of purge gas as described above with respect to the various embodiments.

FIG. 5 also shows vacuum pumps in which valves 506, 517 and 523, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may require precise timing of valves and mass flow controllers (MFCs) supplying pulses of reagent to the semiconductor substrate during deposition. In one way to make this possible, valve and MFC commands are delivered to embedded digital input-output controllers (IOC) in discrete packets of information containing instructions for all time-critical commands for all or a part of a deposition sequence. The ALTUS systems of Lam Research provide at least one IOC sequence. The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, ALD to run at station 1-2 with all timing controlled for all the hardware components needed to deposit a ALD nucleation layer at those stations. A second sequence might be running concurrently to deposit a bulk metal using the timing sequence described above at other deposition stations in the same module. The relative timing of the devices controlling the delivery of reagents to stations 3-4 is important within that group of devices, but the relative timing of the ALD process at stations 1-2 can be offset from the relative timing of stations 3-4. An IOC translates the information in a packetized sequence and delivers digital or analog command signals directly to MFC or pneumatic solenoid banks controlling the valves.

A pulse of metal-containing precursor gas may be generated as follows. Initially, the system diverts $WF_6$ to a vacuum pump for a period of time while the MFC or other flow-controlling device stabilizes. This may be done for a period of between about 0.5 to 5 seconds in one example. Next, the system pressurizes the tungsten gas delivery manifold by closing both the valve 506 to vacuum and the valve 508 to the deposition chamber. This may be done for a period of between about 0.1 and 5 seconds, for example, to create an initial burst of reagent when the valve to the deposition chamber is opened. This is accomplished by opening valve 508 for between about 0.1 and 10 seconds in one example.

Thereafter, the tungsten-containing gas is purged from the deposition chamber using a suitable purge gas. Similar to above, the system may pressurize the purge gas delivery manifold by closing valve 523 and valve 527. Valve 530 and valve 531 are also closed to permit accumulator 519 and 520 to pressurize. This may be done for a period of between about 0.1 and 5 seconds, for example, to rapidly flush reagent from the deposition chamber when the valve to the deposition chamber is opened. When valve 527 is opened to the deposition chamber, valve 530 is opened simultaneously or shortly thereafter to increase the mass flow of purge gas into the deposition chamber. Valve 531 is then opened between about 0.1 and 5 seconds after valve 530 is opened to increase the mass flow of purge gas into the deposition chamber. The pulsed flow of other reagents may be done in a sirnnnlar manner.

Figure 6:
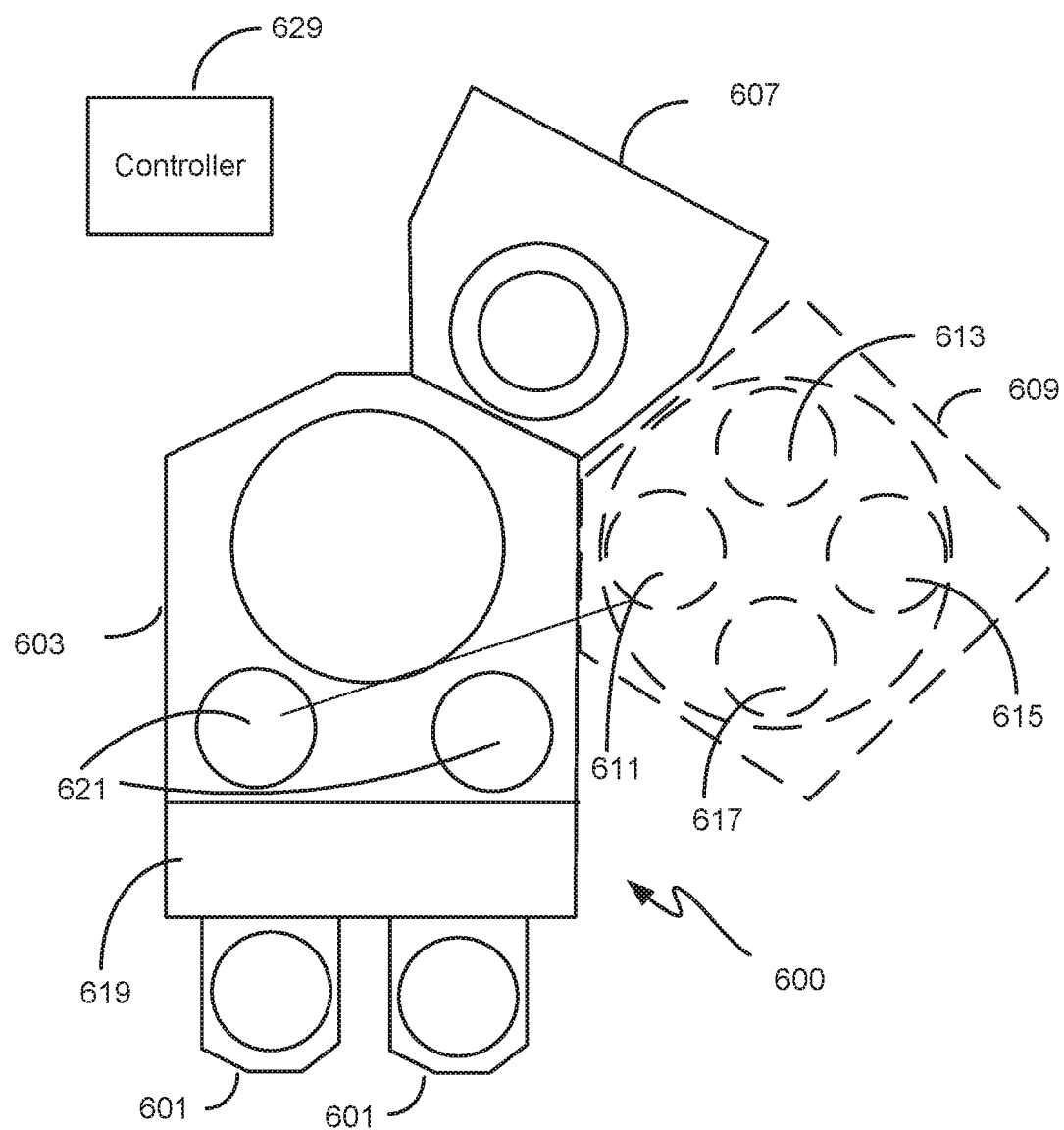
FIGS. 6 and 7 are schematic diagrams of examples of process chambers for performing methods in accordance with disclosed embodiments.

FIG. 6 is a schematic of a process system suitable for conducting deposition processes in accordance with embodiments. The system 600 includes a transfer module 603. The transfer module 603 provides a clean, pressurized environment to minimize risk of contamination of substrates being processed as they are moved between various reactor modules. Mounted on the transfer module 603 is a multi-station reactor 609 capable of performing ALD and CVD according to various embodiments. Multi-station reactor 609 may include multiple stations 611, 613, 615, and 617 that may sequentially perform operations in accordance with disclosed embodiments. For example, multi-station reactor 609 may be configured such that station 611 performs a nucleation layer deposition using a metal halide or metal oxyhalide and station 613 performs an ALD bulk deposition operation according to various embodiments.

Figure 7:
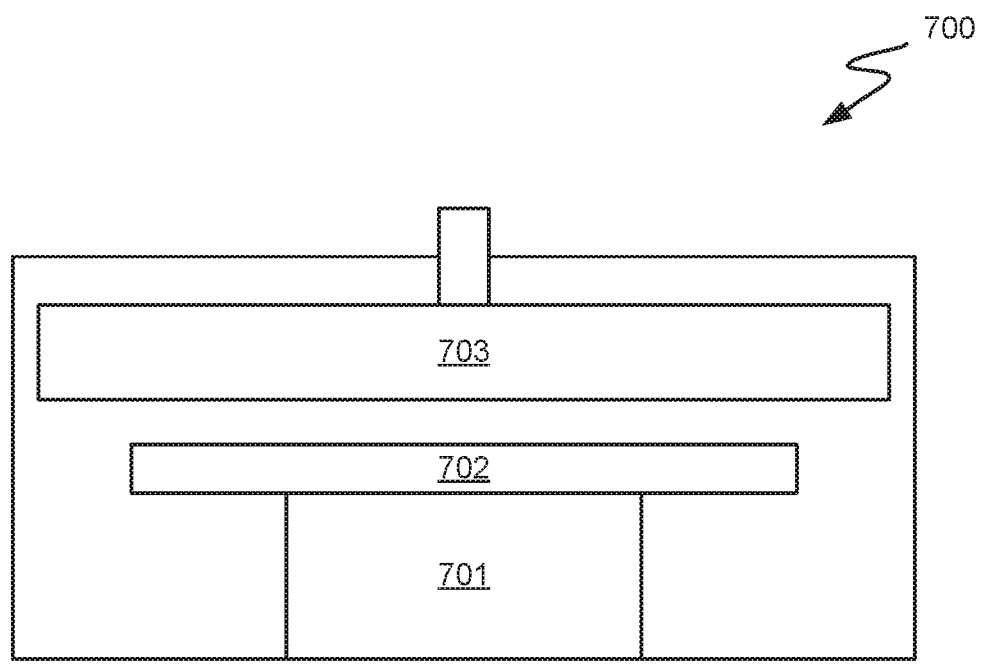

Stations may include a heated pedestal or substrate support, one or more gas inlets or showerhead or dispersion plate. An example of a deposition station 700 is depicted in FIG. 7, including substrate support 702 and showerhead 703. A beater may be provided in pedestal portion 701.

Returning to FIG. 6, also mounted on the transfer module 503 may be one or more single or multi-station modules 607 capable of performing plasma or chemical (non-plasma) pre-cleans, other deposition operations, or etch operations. The module may also be used for various treatments to, for example, prepare a substrate for a deposition process. The system 600 also includes one or more wafer source modules 601, where wafers are stored before and after processing. An atmospheric robot (not shown in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured any suitable way. In general, the logic can be designed or configured in hardware and/or software. The instructions for controlling the drive circuitry may be hard coded or provided as software. The instructions may be provided by "programming" Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the reducing agent pulses, hydrogen flow, metal-containing precursor pulses, inert purge gas flow, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose, include substrate positioning code, process gas control code, pressure control code, and beater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," may control various components or subparts of the system or systems. The controller 629, depending on the processing requirements and/or the type of system, may be programmed to control any of the processes disclosed herein, including the delivery of processing gases, temperature settings (e.g., beating and/or cooling), pressure settings, vacuum settings, power settings, radio frequency (RE) generator settings in some systems, RE matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions conunumicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 629, in some implementations, may be a part of or coupled to a computer that is integrated with, coupled to the system, otherwise networked to the system, or a combination thereof. For example, the controller 629 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 629 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A beater control program may include code for controlling the current to a heating unit that is used to heat the substrate. Alternatively, the beater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility, Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
   providing a semiconductor substrate to a chamber having a chamber pressure less than 100 torr, wherein the semiconductor substrate comprises a partially fabricated three-dimensional (3-D) NAND structure comprising sidewalls and a plurality of openings in the sidewalls leading to a plurality of features having a plurality of interior regions fluidically accessible through the openings;
   depositing a material on the semiconductor substrate by multiple ALD cycles, wherein each cycle comprises flowing into the chamber in sequence:
      a reducing agent;
      a first purge gas;
      a tungsten precursor; and
      a second purge gas; and
   wherein the flowing of the first purge gas and the flowing of the second purge gas each comprise flowing purging gas from a first accumulator with a first charge pressure, followed by flowing purging gas from a second accumulator with a second charge pressure within 5 seconds of flowing the purging gas from the first accumulator, and the first charge pressure and the second charge pressure are between 400 torr and 1000 torr.

2. A method comprising:
providing a semiconductor substrate to a chamber having a chamber pressure;
depositing a material on the semiconductor substrate by multiple ALD cycles, wherein each cycle comprises flowing into the chamber in sequence:
a reactant; and
a purge gas; wherein flowing the purge gas comprises flowing purging gas from a first accumulator with a first charge pressure, followed by flowing purging gas from a second accumulator with a second charge pressure.

3. The method of claim 2, wherein the first charge pressure and second charge pressure are at least two times greater than the chamber pressure.

4. The method of claim 2, wherein the chamber pressure before flowing the purge gas is less than about 100 torr.

5. The method of claim 2, wherein the first charge pressure and second charge pressure are between about 400 torr and about 1000 torr.

6. The method of claim 2, wherein the purging gas is helium, nitrogen, argon, or xenon.

7. The method of claim 2, wherein the reactant comprises a reducing agent.

8. The method of claim 7, wherein the reducing agent is $B_2H_6$, $SiH_4$, or $H_2$.

9. The method of claim 2, wherein the reactant comprises a metal precursor.

10. The method of claim 9, wherein the metal precursor is a metal halide.

11. The method of claim 9, wherein the metal precursor is a metal oxyhalide.

12. The method of claim 9, wherein the metal precursor is a tungsten precursor.

13. The method of claim 12, wherein the tungsten precursor is one of tungsten hexafluoride ($WF_6$), tungsten hexachloride ($WCl_6$), tungsten pentachloride ($WCl_5$), tungsten tetrachloride ($WCl_4$), tungsten dichloride ($WCl_2$), tungsten oxytetrachloride ($WOCl_4$) or tungsten dichloride dioxide ($WO_2Cl_2$).

14. The method of claim 9, wherein the metal precursor is a molybdenum precursor.

15. The method of claim 14, wherein the molybdenum precursor is one of: molybdenum pentachloride (MoCls), molybdenum hexafluoride (MoF6), molybdenum dichloride dioxide (MoO2Cl2 molybdenum oxytetrachloride (MoOCl4), and molybdenum oxvtetrafluoride (MoOF4).

16. The method of claim 2, wherein flowing the purge gas is a choked flow.

17. The method of claim 2, wherein flowing purging gas from the first accumulator is at least partially a choked flow.

18. The method of claim 17, wherein the flowing of purging gas from the second accumulator occurs during the choked flow portion of the flowing of purging gas from the first accumulator.

19. The method of claim 2, wherein the flowing of purging gas from the second accumulator occurs less than 5 seconds after the flowing of purging gas from the first accumulator.

20. The method of claim 2, wherein the semiconductor substrate comprises a partially fabricated three-dimension (3-D) NAND structure comprising sidewalls and a plurality of openings in the sidewalls leading to a plurality of features having a plurality of interior regions fluidically accessible through the openings.

* * * * *